United States Patent [19]

Pundarika

[11] Patent Number: 4,567,395
[45] Date of Patent: Jan. 28, 1986

[54] PIEZOELECTRIC PRESSURE TRANSMITTER FOR AN INTERNAL COMBUSTION ENGINE

[75] Inventor: Eshwarahalli S. Pundarika, Cambridge, Mass.

[73] Assignee: Texas Instruments Incorporated, Dallas, Tex.

[21] Appl. No.: 665,426

[22] Filed: Oct. 26, 1984

[51] Int. Cl.[4] .................................................. H01L 41/08
[52] U.S. Cl. ........................................ 310/338; 73/715; 73/744
[58] Field of Search ............... 310/319, 328, 338, 329; 73/700, 708, 715, 723, 724, 744, 745, 753, 754

[56] References Cited

U.S. PATENT DOCUMENTS

| | | | |
|---|---|---|---|
| 2,096,826 | 10/1937 | Schrader | 310/338 |
| 2,190,713 | 2/1940 | Hintze et al. | 310/338 |
| 2,454,264 | 11/1948 | Stigter | 310/338 |
| 2,917,642 | 12/1959 | Wright et al. | 310/338 |
| 3,269,175 | 8/1966 | Sprosty | 310/329 X |
| 3,364,368 | 1/1968 | Sonderegger | 310/338 |
| 3,461,327 | 8/1969 | Zeiringer | 310/338 |
| 3,566,163 | 2/1971 | Fischer et al. | 310/338 |
| 3,673,443 | 6/1972 | Siegel | 310/338 |
| 3,783,309 | 1/1974 | Ailbert et al. | 310/338 |
| 3,857,287 | 12/1974 | Sonderegger et al. | 310/338 X |
| 4,021,688 | 5/1977 | Kudinov et al. | 310/338 |
| 4,286,687 | 9/1981 | Fiske, Jr. | 310/338 |

*Primary Examiner*—Mark O. Budd
*Attorney, Agent, or Firm*—James P. McAndrews; John A. Haug; Melvin Sharp

[57] ABSTRACT

A cylinder pressure transmitter has means mounting piezoelectric means to provide an electrical signal corresponding to the pressure in a cylinder of an internal combustion engine. A metal diaphragm is arranged to be movable in response to variations in cylinder pressure. Rigid metal motion transfer means and rigid motion transfer means of a material of relatively lower thermal conductivity are arranged in sequence between the diaphragm and the piezoelectric means to accurately transfer movements of the diaphragm to the piezoelectric means while retarding transfer of heat from the cylinder environment to the piezoelectric means through the diaphragm. Preferably the diaphragm is formed of a clad metal laminate.

7 Claims, 8 Drawing Figures

PIEZOELECTRIC PRESSURE TRANSMITTER FOR AN INTERNAL COMBUSTION ENGINE

BACKGROUND OF THE INVENTION

The field of this invention is that of pressure sensors and the invention relates more particularly to a cylinder pressure transmitter responsive to variations in pressure within a cylinder of an internal combustion engine to provide control signals for use in regulating engine operation.

In commonly assigned, copending patent applications Ser. Nos. 561,842 and 561,757 filed Dec. 15, 1983, cylinder pressure transmitters are shown to comprise a body mounting pressure responsive piezoelectric means in sealed relation to an engine cylinder to be responsive to variations in cylinder pressure during engine operation to provide initial electrical signals representative of pressure variations in the cylinder. Those transmitters include metal diaphragms which shield the piezoelectric means from the cylinder environments while transmitting pressure forces from the cylinders to the piezoelectric means for generating the desired pressure responsive signals. High temperature electronic means are carried and electromagnetically shielded on the mounting body of the device for amplifying the signals provided by the piezoelectric means to provide low impedance signals for transmission to computer control or other signal processing means at a location remote from the engine cylinder for regulating engine operation to improve performance. However such cylinder pressure transmitters are somewhat difficult to manufacture at low cost with uniform properties and high reliability and the piezoelectric means tend to be subjected to undesirably high temperatures due to heat-transfer from the engine cylinder environment through the diaphragm. The transmitters are also subjected to heavy vibrations during use so that of electrical connection reliability is of concern. Reference is also made to the commonly assigned copending applications Ser. Nos. 665,327, 665,340 and 665,490 filed of even date herewith.

BRIEF SUMMARY OF THE INVENTION

It is an object of this invention to provide a novel and improved cylinder pressure transmitter; to provide such a pressure transmitter which is adapted to be manufactured with improved economy, uniformity and reliability; and to provide such a pressure transmitter which is better adapted to withstand the severe operating temperatures and vibration conditions likely to be encountered in an internal combustion engine environment.

Briefly described, the novel and improved cylinder pressure transmitter of this invention comprises piezoelectric means adapted to provide an electrical signal in response to application of pressure. Means mount the piezoelectric means to be responsive to pressures in a cylinder of an internal combustion engine during normal running operation of the engine for providing electrical signals corresponding to the cylinder pressures. The mounting means include a metal body having a chamber opening at one end of the body and the piezoelectric means are accommodated in the body chamber. Screw threads or the like are provided on the body near one end of the body for sealing the body end in an engine well communicating with the engine cylinder. Diaphragm means are secured to the body over the chamber opening, preferably to be flush with an end wall of the cylinder. The diaphragm means are responsive to variations in cylinder pressure for transferring pressure forces to the piezoelectric means to provide initial electrical signals corresponding to the cylinder pressures. The diaphragm means also shield the piezoelectric means from the high temperature, gaseous engine cylinder environment. Electronic means are preferably carried and electromagnetically shielded on the mounting means to amplify the initial electrical signals for transmission to a location remote from the engine cylinder.

The metal body has a neck portion which is of reduced diameter relative to the screw threads forming a rim around the chamber opening at the end of the body just ahead of the screw threads. The diaphragm means includes a cup-shaped metal member having a side-wall which is fitted around the reduced-diameter, neck-portion of the body. The side wall is welded to the body entirely around the reduced diameter body portion for sealing the member to the body while disposing the bottom of the cup-shaped member to extend across the body opening to serve as a diaphragm responsive to cylinder pressure variations. Preferably force transmitting means of selected materials, surface areas and crossectional configurations are disposed in the body chamber between the diaphragm member and the piezoelectric means and the bottom of the cup-shaped member bears against the force transmitting means to apply a selected preload compressive force to the piezoelectric means, the side-wall of the cup-shaped member being welded to the neck portion of the body to maintain the desired preload force. Preferably the diaphragm member is attached to the body with a precise laser weld. In one preferred embodiment, the force transmitting means has a surface portion of selected radius at one end engaging a selected area of the center of the bottom of the cup-shaped diaphragm member and the compressive force of that member bearing against that radiused surface provides the member bottom with a slightly domed or parabolic configuration which is accurately responsive to engine cylinder pressure variations to transfer corresponding forces to the piezoelectric means.

In one preferred embodiment, the force transmitting means includes one force spreading component and another component of material of relatively low thermal conductivity. Preferably for example a first rigid force spreading transfer means of metal has a portion of a reduced cross sectional area and a second rigid force transfer means is of a ceramic material or the like of relatively low thermal conductivity. The two force transfer means are arranged in sequence in the body chamber between the diaphragm and the piezoelectric means to cooperate in transferring forces from the diaphragm to the piezoelectric means to provide output signals accurately corresponding to cylinder pressures while also retarding transfer of heat from the engine cylinder to the piezoelectric means through the diaphragm.

In one preferred embodiment, the rigid metal force transfer means comprises a spherical metal ball and the low thermal conductivity force transfer means has a socket-like surface with a configuration of a segment of a sphere rotatably engaged with the ball to facilitate transfer of forces applied to the diaphragm from the diaphragm to the piezoelectric means while providing improved retarding of heat-transfer to the piezoelectric means.

In another preferred embodiment, the metal force transfer means comprises a metal tube having one end engaged with the diaphragm and the second force transfer means comprises a ceramic disc resting on an opposite end of the tube. The tube is substantially limited in crosssectional area for retarding heat transfer while still providing desired strength and rigidity for force transfer purposes. Preferably substantial portions of the force transfer means are spaced from the metal body within the body chamber and the screw thread means are located so they tend to transfer heat from the body to the engine to dissipate heat from the diaphragm before such heat is transferred through the body to the piezoelectric means. In one embodiment, thermally conductive metal means are arranged between the metal tube and the ceramic disc so that heat which is transferred along the tube is shunted away from the ceramic disc to the mounting body to further retard heat-transfer to the piezoelectric means.

In a preferred embodiment, conductor means extend from the piezoelectric means to connect to first contact means having a selected location on the mounting body. Electronic means are then positioned on an insulating ceramic substrate or the like and the substrate is mounted on a separate housing, preferably on a rigid support in such a housing. Second contact means are located on the substrate. The housing and the mounting body are provided with locating and guide surfaces which cooperate as the housing is assembled with the mounting body for automatically bringing the first and second contact means into a secure electrical engagement which is adapted to be reliably maintained even when the pressure transmitter device is subjected to severe vibrations. Means secure the housing and mounting body together with the contact means in the desired assembled relation.

DESCRIPTION OF THE DRAWINGS

Other objects, advantages and details of the novel and improved cylinder pressure transmitter of this invention appear in the following detailed description of preferred embodiments of the invention, the detailed description referring to the drawings in which.

DESCRIPTION OF THE PREFERRED EMBODIMENTS

Figure 1:
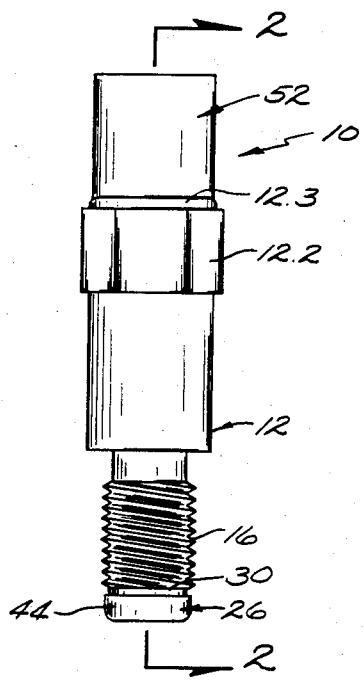
FIG. 1 is a perspective view of the cylinder pressure transmitter.
Figure 2:
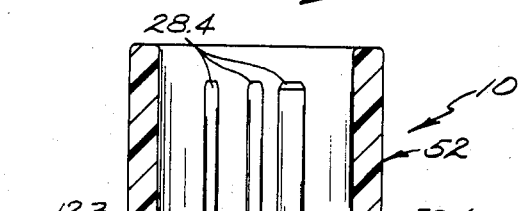
FIG. 2 is a section view to enlarged scale along line 2—2 of FIG. 1.
Figure 2:
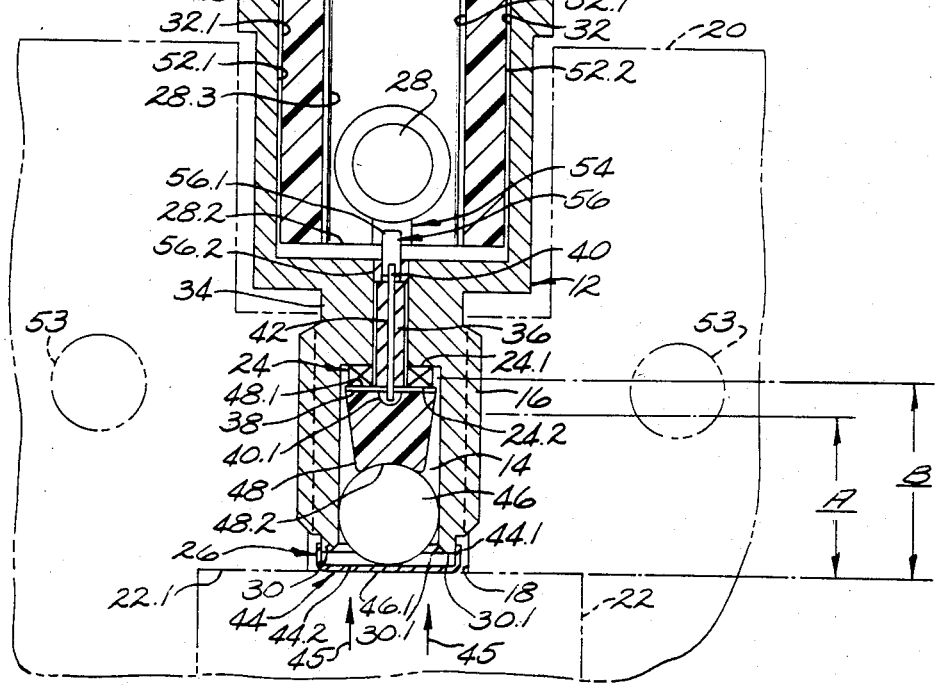
Figure 3:
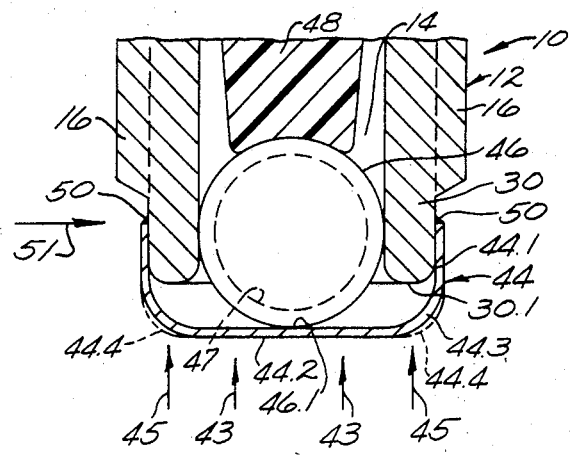
FIG. 3 is a partial section view to greatly enlarged scale similar to FIG. 2 illustrating the diaphragm means of the cylinder pressure transmitter.

Referring to the drawings, 10 in FIGS. 1-3 indicates a novel and improved cylinder pressure transmitter of this invention which is shown to include a metal body 12 of cold rolled steel or the like preferably having the general size and configuration of a small spark plug. The body has a chamber 14 opening at one end 12.1 of the body (see FIG. 2) and sealing means such as screw threads 16 are provided near that end of the body for mounting the device 10 in sealed relation within a well 18 in an internal combustion engine 20 to face the opening of the chamber 14 toward the engine to present it to the pressure environment within a piston cylinder 22 in the engine. Piezoelectric means 24 responsive to the application of pressure for generating an electrical signal are accommodated in the body chamber 14 and diaphragm means 26 are arranged over the chamber opening to be responsive to pressure changes in the cylinder to transmit pressure forces to the piezoelectric means to generate electrical signals corresponding to the cylinder pressures. Preferably the outer surface of the diaphragm means is generally flush with the cylinder end wall 22.1 as illustrated in FIG. 2. Electronic means 28 are mounted and preferably electromagnetically shielded on the metal mounting body 12 to amplify the initial electrical signals provided by the piezoelectric means for transmission to computer control means or the like (not shown) at a location remote from the cylinder.

As shown in FIG. 2, the metal body 12 has a neck portion 30 formed as a rim around the opening in the chamber 14. The neck portion is of reduced diameter relative to the screw thread 16 for easy insertion into the engine well 18 and preferably the neck portion has a radiused edge 30.1 (see FIG. 3). Preferably the body 12 has another chamber 32 opening at the opposite body end and a support section 34 is located between the chambers with a passage 36 extending through the support section. Preferably an exterior body portion 12.2 is hexagonal to meet the standards established by the Society of Automotive Engineers to facilitate threaded mounting of the device on the engine.

The piezoelectric means 24 preferably comprises an apertured disc or donut of a material such as a ceramic lead zirconium titanate or lead metaniobate or the like having a conventional conductive charge-collecting coating of silver or the like (not shown) on opposite sides 24.1, 24.2 of the disc. Preferably the disc material has Curie temperature above about 175° C. One side 24.1 of the disc bears against the support section 34 and an electrode 38 such as an apertured stainless steel plate or the like bears against the opposite side 24.2 so the electrode and support section electrically engage the respective opposite disc sides. A conductor rod or wire 40 is welded, soldered or otherwise connected to the electrode as at 40.1 and typically extends through the disc and plate apertures and the passage 36 toward the chamber 32 as shown in FIG. 2. Alternately the electrode is not apertured and one end of the conductor 40 is resistance welded to the electrode. Preferably an insulator 42 such as a tube of tetrafluoroethylene or the like suitable for use at the high temperatures likely to be encountered adjacent an engine cylinder is fitted over the conductor to electrically isolate it from the piezoelectric disc and from the metal body 12.

The diaphragm means 26 as above described includes a cup-shaped diaphragm member 44, and force transmitting means such as the force transfer means 46 and 48 illustrated in FIG. 2. Preferably one of the force transfer means comprises a rigid metal force spreading component which has at least a portion of limited crosssectional size or surface area disposed at a location between the cup-shaped diaphragm member 44 and the piezoelectric means 24 to retard heat transfer through the metal force transfer means. Preferably another one of the force transfer means comprises a component of a material of relatively lower thermal conductivity having a relatively large surface area bearing against the piezoelectric means to facilitate transfer of pressure force to the piezoelectric means while further retarding heat transfer.

In the preferred embodiment illustrated in FIGS. 1-3, the cup-shaped diaphragm member 44 has an original configuration in which a generally cylindrical side-wall 44.1 and a generally planar cup bottom 44.2 are connected by a portion 44.3 of selected radius. Preferably the diaphragm member is formed of a springy, stiffly resilient temperature and corrosion resistant metal material such as the alloy called Inconel which has a nominal composition by weight of 80 percent nickel, 14 percent chromium and 6 percent iron. Such material is fatigue resistant and capable of withstanding the harsh chemical environment of engine combustion. Preferably the member has a diameter of about 8 millimeters, a material thickness of about 0.005 to 0.010 inches (0.1 to 0.2 millimeters), and preferably about 0.007 inches, and a dehpt of about 3 millimeters. The force transfer means 46 comprises a spherical metal ball of stainless steel or the like and is preferably of a size to be rotatable and axially movable along the longitudinal axis of the chamber 14 while tending to be centered in the chamber by the chamber side walls. If desired the ball is hollow as indicated at 47. The second force transfer means 48 comprises a ceramic material of low thermal conductivity such as a strong, easily shaped and somewhat lubricious pressed steatite material, or glass or the like. The second force transfer means has one side 48.1 which is preferably of relatively large surface area corresponding generally to that of the piezoelectric disc 24 for applying compressive force to the disc across the entire disc surface 24.2. The opposite side 48.2 preferably has a relatively smaller surface area in the shape of a socket or segment of a sphere of a diameter substantially corresponding to that of the ball 46 rotatably engaged with the ball.

In assembling the structure illustrated in FIG. 2 and 3, the cup-shaped member 44 is fitted over the neck portion 30 on the mounting body and is pressed with a selected force near the periphery of the member as indicated by arrows 45 in FIG. 3 so that the bottom 44.2 of the diaphragm member bears against the ball 46 and transfers that force to the socket 48 to apply a desired, predetermined preload compressive force to the piezoelectric means. The side wall 44.1 of the cup-shaped member is then welded as at 50 to the mounting body neck 30 for securing the cup member in the desired preload position on the mounting body. Where the diaphragm member material is thin relative to the bottom material as illustrated in FIG. 3, the weld 50 is preferably formed at the edge of the rim of the cup-shaped member 44 as shown in FIG. 3 and preferably comprises a precisely located pulsed laser weld formed around the mounting body neck 30 as diagrammatically illustrated in FIG. 3 by the arrow 51. With such a weld the cup member is sealed over the chamber 14 and retains the force transmitting means with a selected preload compressive force while the cup member material retains its initial spring resilience. In that arrangement, the original configuration of the diaphragm member as indicated by the broken line 44.4 in FIG. 3 is somewhat altered so the cup bottom 44.2 has a somewhat domed or parabolic shape and so that the cup bottom is adapted to flex in a reliable and consistent manner in response to fluid pressure forces applied to the diaphragm as indicated by arrows 43 in FIGS. 1 and 3 for transmitting the presssure forces to the piezoelectric means 24. The radius 30.1 on the mounting body neck assures that such flexing is free of interference with the neck.

The screw threads 16 are preferably located on the body 12 at a selected distance A from the diaphragm member 44 so that when the device 10 is mounted on the engine 22 by means of the threads, the threads engage the engine immediately adjacent the fluid coolant passages diagrammatically illustrated at 53 in FIG. 2 which are typically provided in an internal combustion engine for dissipating heat from the engine in the area close to the cylinders 18. The chamber 14 is preferably of selected length such that the piezoelectric means 24 are located in the chamber at a distance B from the diaphragm member which is equal to, lesser or greater than the distance A as may be preferred. Where the piezoelectric means is located at a distance B equal to or less than the distance A but adjacent the cooling means 53, the piezoelectric means is located where heat is being most rapidly dissipated from the mounting body to keep the piezoelectric means relatively cool either during running operation of the engine or during the initial period after shutting off the engine when external engine temperatures may tend to rise sharply for a brief period of time. Alternately, where the distance B is greater than the distance A, the piezoelectric means have a greater spacing from the engine cylinder thermally isolating the piezoelectric means from the cylinder temperatures as will be understood.

The force transfer means 46 and 48 are arranged to transmit pressure from the diaphragm member 44 to the piezoelectric means while further retarding heat-transfer from the engine cylinder to the piezoelectric means through the diaphragm means. That is, the limited crosssection or surface area 46.1 of the first force transfer means engages the diaphragm bottom 44.2 at a location between the diaphragm bottom and the piezoelectric means 24 and accordingly heat transfer to the piezoelectric means through that limited crosssection or area of the ball is substantially retarded. However, the rigid high strength character of the ball material assures that any pressure force applied to the diaphragm bottom 44.2 is properly transmitted to the ball. The socket surface 48.2 of the second force transfer means engages a similarly sized but still limited cross-section or surface area of the ball at a second location between the diaphragm and piezoelectric means so that, while the area of that surface engagement assures proper transmission of presssure forces to the ceramic socket member with reduced risk of cracking, heat transfer to the piezoelectric means through the second force transfer means is again retarded. Use of the socket compensates for any lack of parallelism in the structure so the larger surface area side 48.2 of the socket reliably applies pressure force over the entire side 24.2 of the piezoelectric disc.

Accordingly the device 10 provides improved transmission of pressure forces to the piezoelectric means while also providing improved retardation of heat transfer to the piezoelectric means for improved device reliability and service life.

In that preferred embodiment of the invention as shown in FIG. 2, the electronic means 28 preferably comprises high temperature hybrid electronics or the like such as have been described in the earlier filed, copending patent applications noted above. In this embodiment however, the electronics 28 are preferably mounted on an insulating substrate 28.1 of a ceramic material or the like as diagrammatically shown in FIG. 2 and the substrate is mounted in a housing means 52 on a rigid support such as the cylindrical housing wall 52.1 so that one edge 28.2 of the substrate is preferably disposed somewhat spaced from the rigid support at a predetermined positive location in the housing 52. The housing means is preferably detachably mounted on the body so that the electronic means 28 in the housing are secured in a predetermined position relative to the body 12 to be easily and reliably interconnected with the piezoelectric means through the conductor 40 and to be retained in that interconnection when subjected to the heavy vibrations likely to be encountered in an internal combustion engine environment. Preferably for example, the body chamber 32 provides guide surfaces 32.1 and a locating surface 32.2. The electronic means substrate 28.1 is disposed closely within the housing means 52 so that a cylindrical side wall 52.1 of the housing provides a rigid support for edges 28.3 of the substrate and also provides a guide surface 52.2, the housing also having locating surfaces 52.3 and 52.4 provided on a housing flange. Terminals 28.4 provided on the electronic means preferably extend from the housing means 52 in any conventional manner as shown in FIG. 2. The electronic means are provided with first fixed contact means 54 such as a circuit path termination at the edge 28.2 of the substrate as diagrammatically illustrated in FIG. 2, that portion of the edge 28.2 being spaced from the cylinder 52.1 as will be understood. Second, resilient, electrical contact means 56 are mounted on the body 12 connected to the conductor 40 to mate with the substrate contact 54. Preferably for example, a pair of spring leaves 56.1 (only one being shown) are secured to the conductor 40 by soldering or the like and are insulated from the body 12 by a bushing 56.2. The guide and locating surfaces of the housing means 52 and the device body 12 then cooperate as the housing body is inserted into the body chamber 32 to guide the substrate edge with the fixed and resilient contact means 54 between the spring leaves 56 into secure and reliable electrical engagement with each other. A body flange 12.3 is then rolled or otherwise formed over the housing locating surfaces for securing the electronic means on the body in secure and reliable electrical connection to the piezoelectric means 24. The metal body 12 surrounds the electronic means 28 in the chamber 32 as shown for providing the electronic means, the piezoelectric means, and the connection therebetween with electromagnetic shielding.

Figure 4:
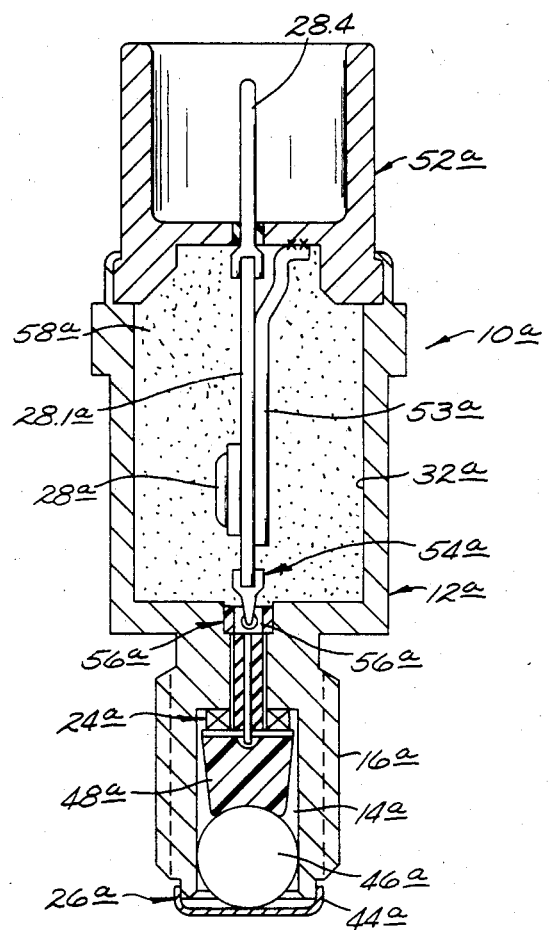
FIG. 4 is a section view similar to FIG. 2 illustrating an alternate preferred embodiment of the cylinder pressure transmitter.

In another alternate preferred embodiment of the invention as shown in FIG. 4, wherein corresponding components are identified by corresponding reference numerals, the housing means 52 a is formed of metal and a metal support 53 a for the substrate 28.1 a extends into the body chamber 32 a. A fixed contact pin 54 a is connected to the circuit path on the substrate and the resilient second contact means comprises a spring clip 56 a having spring leaves engaging the pin 54 a inserted therein for precisely locating the end of the substrate 28.1 a to assure precise engagement between the fixed and resilient contact means 54 a and 56 a as will be understood. Preferably the space within the chamber 32 a is filled with a potting material 58 a of any conventional type for thermally and electrically isolating the electronic means from the body 12 a while also securing the electronic means against vibration forces. For example a highly viscous material 58 a could be introduced around the electronic means to reduced the effects of vibration.

Figure 5:
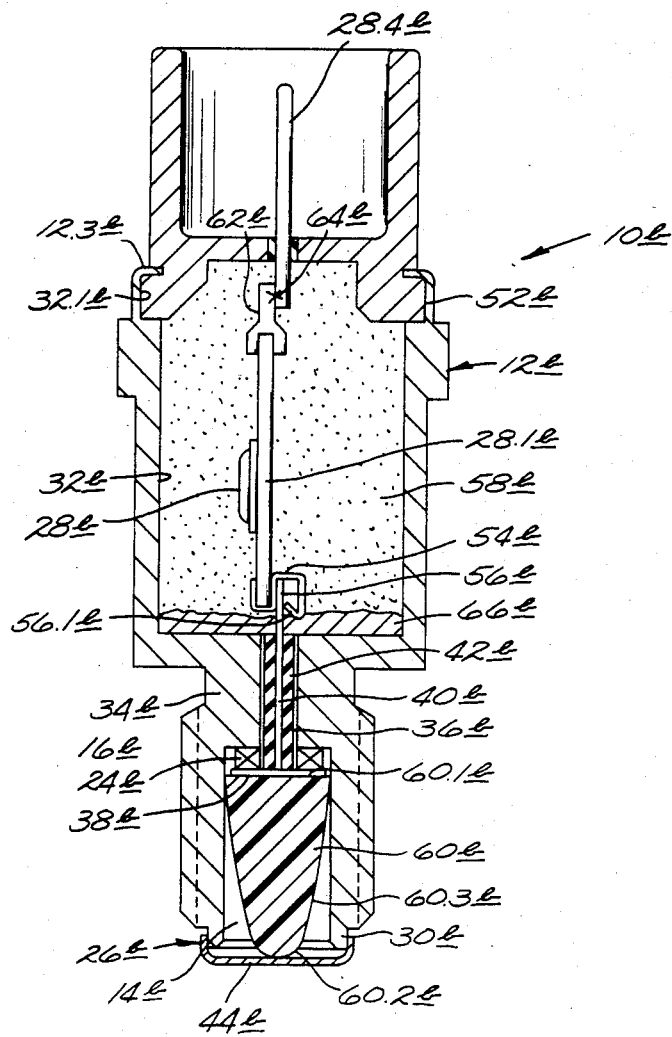
FIG. 5 is a section view similar to FIG. 2 of an alternate preferred embodiment of the cylinder pressure transmitter.

In another alternate preferred embodiment as shown in FIG. 5, the diaphragm means 26 b comprises a single component force transmitting means 60 b in the form of a ceramic member having one side 60.1 b bearing against the piezoelectric means and having an opposite side 60.2 b of a radius corresponding to the ball 46 b preferably tapering as indicated at 60.3 b. The force transmitting means is assembled with the cup-shaped member 44 b in the manner previously described and the single force transmitting component is centered and is of relatively low mass to cooperate with the cup-shaped member to provide precise pressure responsive characteristics in the device.

In the embodiment shown in FIG. 5 the electronic means 28 b is preferably mounted on a ceramic substrate 28.1 b which is mounted on the housing 52 b. Preferably for example, a pin 62 b is soldered to circuit path means (not shown) on the substrate and the pin is welded or otherwise connected to the terminal 28.4 b as diagrammatically indicated at 64 b in FIG. 5. The first contact means 54 b are provided on the substrate edge by securing a U-shaped spring clip to circuit path means (not shown) on the substrate. The second contact means 56 b comprises an extension of the conductor 40 b as shown in FIG. 5 and the insulator 42 b efectively seals the passage 36 b. An epoxy or other fixed holding compound curable or settable in situ or the like is deposited in the bottom of the chamber 32 b and the housing 52 b is mounted on the body 12 b so the locating surfaces 52.2 b are engaged with the body and so that the first contact clip 54 b slips over and electrically engages the second contact means 56 b. Preferably a barb 54.1 b on one leg of the U-shaped clip extends back on itself to grip the contact means 56 b to provide an assured connection between the contact means. The epoxy is then set or cured in situ for locking the contact means 54 b and 56 b securely together. The flange 12.3 b then secures the device in assembled relation. Preferably a resilient or viscous potting compound 58 b is also used over the fixed holding compound 66 b.

Figure 6:
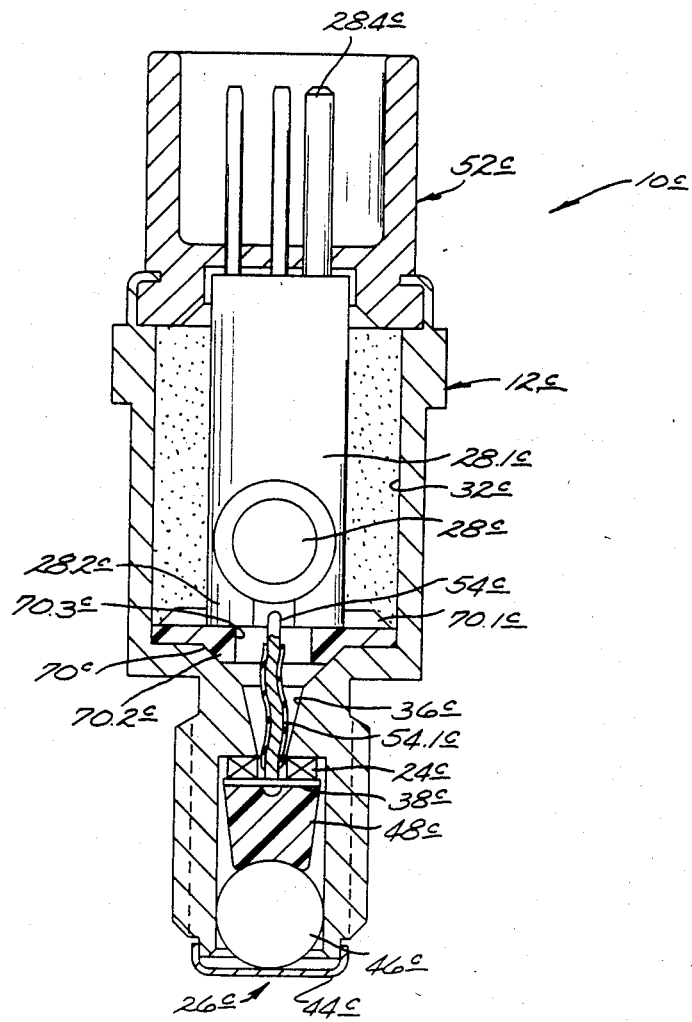
FIG. 6 is a section view similar to FIG. 2 of another alternate preferred embodiment of the pressure transmitter.

In another alternate embodiment as illustrated in FIG. 6, the passage 36 c formed in the mounting body 12 c is preferably tapered from a larger opening at the chamber 32 c to a narrower opening adjacent the piezoelectric donut 24 c. The first contact means 54 c comprises a spring lead with an insulator 54.1 c which is secured to circuit path means on the electronics substrate 28.1 c so that it extends into the passage 36 c with a selected bow in the lead as shown and passes through the piezoelectric donut 24 c to resiliently and electrically engage the electrode 38 c. The electrode than serves as the second contact means of the device. In that arrangement, the housing 52 c is mounted on the body 12 c by means of guide and locating surfaces as previously described and the tip of the spring lead 54 c is secured in the passage 36 c and guided into resilient electrical engagement with the electrode 38 c as will be understood. If desired, the electrode 38 c has a small central opening smaller than the tip of the first contact means 54 c for receiving and centering the tip in the opening. Preferably the spring lead wire 54 c has selected thermal expansion and resilient characteristics so the force of the lead engaging the electrode does not significantly alter the forces applied to the piezoelectric means during device operation. If desired, a centering support piece 70 c of a temperature resistant polymer such as tetrofluroethylene or the like has a groove 70.1 c receiving the edge 28.2 c of the electronic substrate and has a tapered locating boss 70.2 c centering the support in the passage 36 c so the lead 54 c passes through the insulating support aperture 70.3 c.

Figure 7:
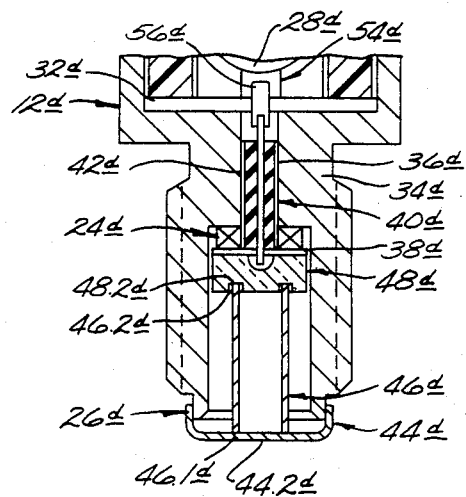
FIGS. 7-8 are partial section views similar to FIG. 2 illustrating other alternate preferred embodiments of the invention.

In another alternate preferred embodiment of the invention as shown in FIG. 7, the diaphragm means 26 d comprises a cup-shaped diaphragm member 44 d corresponding to that previously described with reference to FIGS. 1 and 2. In this embodiment however, the first metal force transfer means 46d preferably comprises a section of stainless steel tube or the like having one end 46.1 d engaged with the diaphragm bottom 44.2 d. The second force transfer means 48 d comprises a ceramic disc having a groove 48.2 d receiving the opposite end 46.2 d of the tube. The tube has a relatively small cross-sectional area between the diaphragm and the piezoelectric means for limiting heat transfer between the diaphragm and piezoelectric means.

Figure 8:
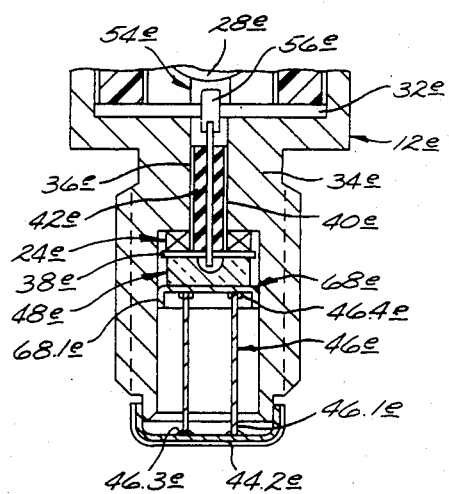

In another alternate preferred embodiment as shown in FIG. 8, the diaphragm means comprises a cup-shaped diaphragm member having one end 46.1 e of a tube-shaped first force transfer means secured to the diaphragm bottom 44.2 e as indicated at 46.3 e. A thermal shunt member 68 e of copper or the like of relatively high thermal conductivity is disposed between the first force transfer means 46 e and the second cylindrical ceramic disc force transfer means 48 e to resiliently engage the metal body 12 e in heat-transfer relation thereto as indicated at 68.1 e. Preferably the shunt means is secured to the tube as indicated at 46.4 e. In that arrangement the tube 46 e and disc 48 e retard heat-transfer from the diaphragm bottom 44.2 e to the piezoelectric means and the thermal shunt 68 e tends to further retard such heat transfer by transfering heat away from the opposite 46.2 e of the tube to the metal body 12 e rather than to transfer such heat to the ceramic disc 24 e.

In the alternate preferred embodiment illustrated in FIG. 8, the diaphragm member 44 e is formed of a composite metal material having layers of metal of selected spring, thermal and corrosion resistant characteristics combined for providing improved pressure response and cycle life characteristics in the pressure transmitter. Preferably for example the diaphragm material has a core layer 44.5 e of stainless steel having outer cladding layers 44.6 e of equal thickness of Inconel metallurgically bonded to opposite sides of the core layer. In such a composite metal laminate material, the core layer 44.5 e provides the composite with desired stiff resilience while the clading layers 44.6 e protect the composite against chemical corrosion in the engine combustion environment, the core and cladding layers being selected relative to each other so that intermetallic compounds or the like are not formed between the layers in the high temperature environment such as may tend to cause delamination or embrittlement or the like.

It should be understood that although preferred embodiments of the invention have been described by way of illustrating the invention, the invention includes all modifications and equivalents of the disclosed embodiments falling within the scope of the appended claims.

I claim:

1. A device for providing an electrical signal corresponding to pressure in a cylinder of an internal combustion engine during normal running operation of the engine comprising piezoelectric means for providing an electrical signal in response to application of presssure, and means for mounting the piezoelectric means to be responsive to pressure in a cylinder of the engine, the mounting means including a body having a chamber opening at one end of the body accommodating the piezoelectric means therein, means for sealing said one body end in an engine well communicating with the cylinder, and diaphragm means secured over the chamber opening at said one body end to be movable in response to variations in fluid pressure in the engine cylinder to transfer forces to the piezoelectric means to provide an electrical signal corresponding to said cylinder pressure variation while shielding the piezoelectric means from an environment within the cylinder, first rigid motion transfer means of a metal material having a portion of a cross section of relatively lesser area than said diaphragm, and second rigid motion transfer means of a material of relatively lower thermal conductivity then said first motion transfer means, the first and second motion transfer means being arranged in sequence between the metal diaphragm and the piezoelectric means to be freely movable with the diaphragm to transfer movements of the diaphragm to the piezoelectric means to provide said electrical signal while retarding the transfer of heat from the diaphragm through the motion transfer means to the piezoelectric means.

2. A device according to claim 1 further characterized in that the body is a metal body for transferring heat away from the diaphragm, the sealing means are adapted to secure the body in close heat-transfer relation to said engine for dissipating heat from the body to the engine, and the motion transfer means of relatively low thermal conductivity material is formed of a ceramic material and the metal and ceramic means are mounted in the body chamber with substantial portions of each of the motion transfer means spaced from the body within the chamber for substantially retarding heat-transfer to the piezoelectric means.

3. A device according to claim 2 further characterized in that a thermally conducting metal shunt is disposed between the metal and ceramic motion transfer means, the shunt being secured in heat-transfer relation to the metal body for shunting heat transferred through the metal transfer means away from the ceramic motion transfer means for further retarding heat-transfer to the piezoelectric means.

4. A device according to claim 3 wherein said metal motion transfer means comprises a metal tube having one end engaged with said diaphragm and the ceramic transfer means comprises a ceramic cylinder mounted on an opposite end of said tube.

5. A device according to claim 4 wherein said one tube end is secured to the diaphragm.

6. A device for providing an electrical signal corresponding to pressure in a cylinder of an internal combustion engine during normal running operation of the engine comprising piezoelectric means for providing an electrical signal in response to application of pressure, and means for mounting the piezoelectric means to be responsive to pressure in a cylinder of the engine, the mounting menas including a metal body having a chamber opening at one end of the body accommodating the piezoelectric means therein, having means for mounting the body in an engine well communicating with the cylinder, and having diaphragm means secured over the chamber opening at said one end to be responsive to variations in fluid pressure in the engine cylinder to transfer forces to the piezoelectric means to provide said electrical signals corresponding to said cylinder pressure variations while shielding the piezoelectric means from the gaseous environment in the cylinder, characterized in that the diaphragm comprises a composite metal laminate material having a core layer of a metal material selected for its spring characteristics and an outer layer of another metal material selected for its corrosion resistance characteristics metallurgically bonded to each side of the core layer of the laminate.

7. A device according to claim 6 wherein the core layer of the laminate material is formed of stainless steel and the outer layers thereof are formed of an alloy having a nominal composition by weight of 80 percent nickel, 14 percent chromiunm, and 6 percent iron.

* * * * *